(12) United States Patent
Lenormand et al.

(10) Patent No.: US 7,388,373 B2
(45) Date of Patent: Jun. 17, 2008

(54) METHOD OF DETERMINING THE PERMEABILITY OF AN UNDERGROUND MEDIUM FROM NMR MEASUREMENTS OF THE PERMEABILITY OF ROCK FRAGMENTS FROM THE MEDIUM

(75) Inventors: Roland Lenormand, Rueil Malmaison (FR); Marc Fleury, La Celle Saint Cloud (FR); Patrick Egermann, Rueil Malmaison (FR)

(73) Assignee: Institut Francais du Petrole, Rueil Malmaison, Cedex (FR)

( * ) Notice: Subject to any disclaimer, the term of this patent is extended or adjusted under 35 U.S.C. 154(b) by 149 days.

(21) Appl. No.: 11/012,096

(22) Filed: Dec. 16, 2004

(65) Prior Publication Data
US 2005/0168220 A1 Aug. 4, 2005

(30) Foreign Application Priority Data
Dec. 17, 2003 (FR) ................................ 03 14961

(51) Int. Cl.
*G01V 3/00* (2006.01)
*G01L 7/00* (2006.01)
*G01N 15/08* (2006.01)

(52) U.S. Cl. ........................ 324/303; 702/138; 73/38
(58) Field of Classification Search ................ 324/303; 702/138; 73/38
See application file for complete search history.

(56) References Cited

U.S. PATENT DOCUMENTS

| | | | |
|---|---|---|---|
| 5,289,124 A * | 2/1994 | Jerosch-Herold et al. | ... 324/303 |
| 5,387,865 A | 2/1995 | Jerosch-Herold et al. | |
| 5,936,405 A * | 8/1999 | Prammer et al. | ........... 324/303 |
| 6,008,645 A | 12/1999 | Bowers et al. | |
| 6,040,696 A * | 3/2000 | Ramakrishnan et al. | ..... 324/303 |
| 6,242,912 B1 * | 6/2001 | Prammer et al. | ........... 324/303 |
| 6,453,727 B1 * | 9/2002 | Lenormand et al. | ........... 73/38 |
| 6,512,371 B2 * | 1/2003 | Prammer | ..................... 324/303 |

(Continued)

OTHER PUBLICATIONS

Egermann P. et al.: "A fast and direct method of permeability measurements on drill cuttings" Proceedings of the 2002 SPE Annual Technical Conference and Exhibition, San Antonio, TX, US, Sep. 29-Oct. 2, 2002, pp. 1993-2000, XP009034279.

(Continued)

*Primary Examiner*—Brij B. Shrivastav
*Assistant Examiner*—Dixomara Vargas
(74) *Attorney, Agent, or Firm*—Antonelli, Terry, Stout & Kraus, LLP.

(57) ABSTRACT

Method of determining the permeability of an underground medium from NMR logs of the permeability of rock fragments from the medium, based on prior calibration of the permeability resulting from this measurements, from direct measurement on rock fragments, such as cuttings for example. The method mainly comprises measuring permeability (k) from rock fragments, measuring the signal produced by a device allowing NMR analysis of the rock fragments previously saturated with a protonated liquid (brine for example), obtaining optimum values for the parameters of a relation giving the permeability as a function of the NMR signal, and applying this relation to the well zones that have already been subjected to NMR logging but for which no direct permeability measurements are available. One example of one of the applications for the present invention is the evaluation of a hydrocarbon reservoir.

3 Claims, 3 Drawing Sheets

U.S. PATENT DOCUMENTS

Figure 3:
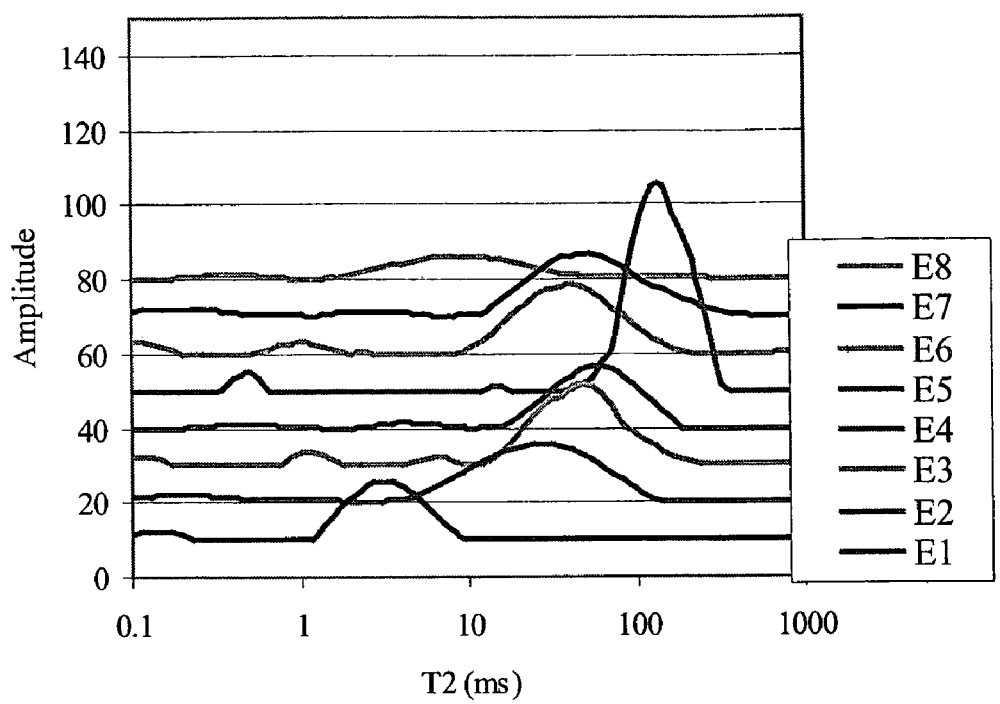

| | | | | |
|---|---|---|---|---|
| 6,956,371 | B2 * | 10/2005 | Prammer | 324/303 |
| 7,131,317 | B2 * | 11/2006 | Lenormand et al. | 73/38 |
| 2003/0231017 | A1 * | 12/2003 | Kiesl et al. | 324/303 |
| 2004/0119471 | A1 * | 6/2004 | Blanz et al. | 324/303 |
| 2005/0007109 | A1 * | 1/2005 | Thomann et al. | 324/303 |
| 2005/0216223 | A1 * | 9/2005 | Lenormand et al. | 702/138 |

OTHER PUBLICATIONS

Timur A: "Pulsed Nuclear Magnetic Resonance Studies of Porosity, Movable Fluid, and Permeability of Sandstones" Journal of Petroleum Technology, AIME, Dallas TX, US, Juin 1969 pp. 775-786 XP008014691.

Fleury M. et al: "Validity of permeability prediction from NWR measurements" Comptes Rendus De L'Academie Des Sciences Series IIC chemistry, vol. 4, No. 11, Nov. 2001 pp. 869-872, XP002289453.

* cited by examiner

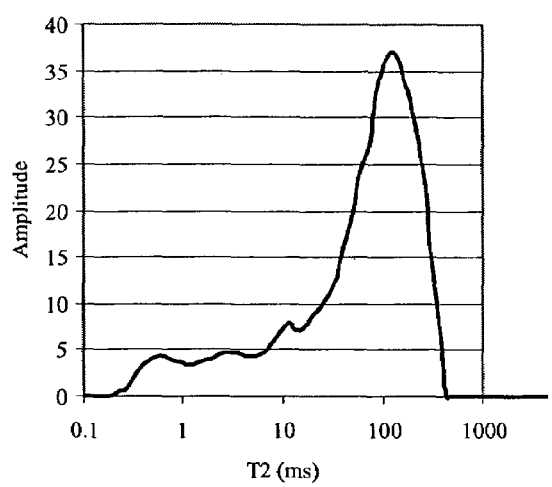
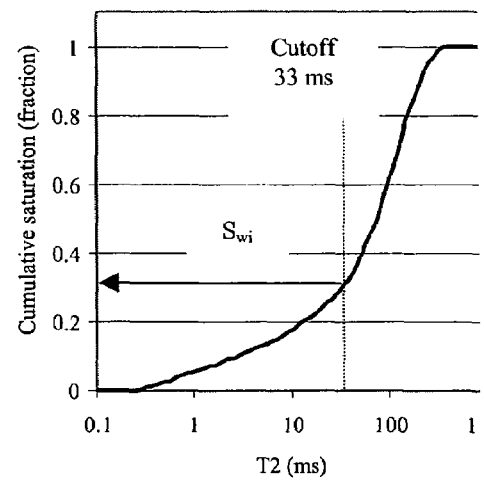
Fig.1A                           Fig.1B
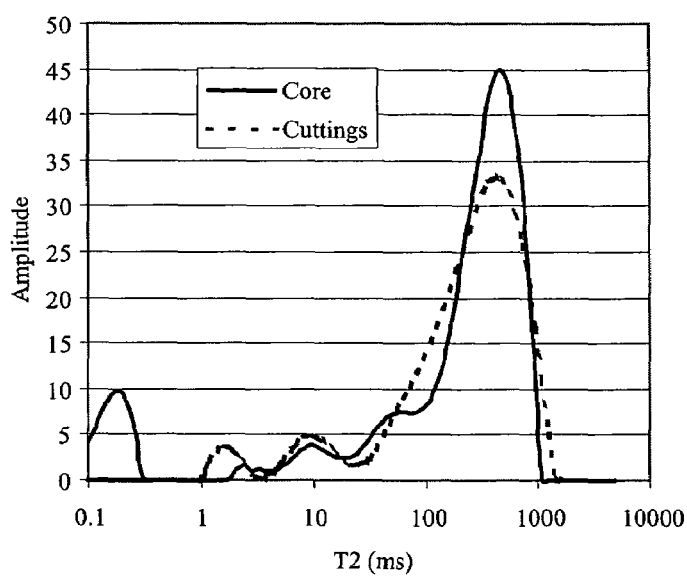
Fig.2

METHOD OF DETERMINING THE PERMEABILITY OF AN UNDERGROUND MEDIUM FROM NMR MEASUREMENTS OF THE PERMEABILITY OF ROCK FRAGMENTS FROM THE MEDIUM

FIELD OF THE INVENTION

The present invention relates to a method of determining the permeability of an underground medium from NMR logs of the permeability of rock fragments from this medium, based on prior calibration of the permeability resulting from these measurements, from direct measurements on rock fragments such as cuttings for example.

I-BACKGROUND OF THE INVENTION

The prior art is illustrated by the following publications some of which will be mentioned by way of reference in the description hereafter.

Clark, R. K. and K. L. Bickham: "A mechanistic model for cuttings transport", SPE No.28306, 69$^{th}$ Annual Technical Conference and Exhibition, New Orleans, 25-28 September 1994, Fleury, M.: "Validity of permeability prediction from NMR measurements ", No. GERM Annual Meeting, La Pommeray, France, 14-18 May 2001, Godefroy, S.: "Etudes RMN de la dynamique des molécules aux interfaces solide-liquide: des matériaux poreux calibres aux roches réservoirs ", Thése de l'Ecole Polytechnique, 2001, Kenyon, W. E.: <<A three-part study of NMR longitudinal relaxation properties of water saturated sandstones >>, SPE Formation Evaluation, March, pp. 622-636, 1989, Logan, W. D., J. P. Horkowitz, R. Laronga et al.: <<Practical Application of NMR logging in carbonate reservoirs >>, SPE Reservoir Eval. & Eng., October, pp. 438-448, 1998, Naegel, M., E. Pradié, T. Delahaye et al. <<Cuttings flow meters monitor hole cleaning in extended reach wells >>, SPE No. 50677, European petroleum conference, The Hague, The Netherlands, 20-22 October 1998, Nigh, E. and M. Taylor: "Wellsite determination of porosity and permeability using drilling cuttings ", C. W. -1. Society 10$^{th}$ Formation Evaluation Symposium, 1985, Pilehvari, A. A., J. J. Azar and S. A. Shirazi: "State-of-the-art cuttings transport in horizontal wellbores ", SPE No. 37079, International conference on horizontal well technology, Calgary, Canada, 18-20 November 1996, Santarelli, F. J., A. F. Marsala, M. Brignoli et al.: <<Formation evaluation from logging on cuttings >>, SPE Reservoir Eval. & Eng., June, pp. 238-244, 1998, Seevers, D. O.: "A nuclear magnetic method for determining the permeability of sandstones ", No. SPWLA 1966, or Timur, A.: "An investigation of permeability, porosity and residual water saturation relationships ", No. SPWLA 1968.

I-1 Existing Petrophysical Measurements from Rock Fragments

Measurement of petrophysical parameters such as permeability, porosity and capillary properties on rock fragments taken up to the surface during drilling of a well through an underground formation constitutes an interesting opportunity for operator companies to obtain rapidly a first petrophysical characterization of producing zones crossed through by the well.

Patent FR-2,809,821 filed by the applicant describes a system for evaluating physical parameters such as the absolute permeability of porous rocks in a zone of an underground formation, from cuttings carried up to the surface with the drilling mud. In an enclosure where the cuttings are immersed in a viscous fluid, some of this fluid is injected at a pressure increasing with time, up to a predetermined pressure threshold, so as to compress the gas trapped in the pores of the rock. This injection phase is followed by a relaxation stage with injection stop. The evolution of the pressure during the injection process having been modelled from initial values selected for the physical parameters of the cuttings, a computer adjusts them iteratively so as to allow the modelled pressure curve to best coincide with the pressure curve really measured.

Patent applications FR-02/0,023 and FR-03/03,742 filed by the applicant describe another method of evaluating physical parameters such as the absolute permeability and the porosity of rocks in a zone of an underground formation, also from cuttings. An enclosure containing the rock fragments and filled with a viscous fluid is communicated with a tank containing this fluid at a predetermined pressure so as to compress the gas trapped in the pores of the rock. The application time of this pressure, according to whether it is short or long, allows to measure either the pressure variation in the enclosure or the variation of the volume effectively absorbed by the rock fragments. Then, the evolution of the pressure or of the volume in the enclosure is modelled from initial values selected for the physical parameters of the rock fragments so that the modelled evolution best adjusts with the measured evolution of the physical parameter in the enclosure.

I-2 Use of NMR in the Petroleum Industry

The non-intrusive measuring technique referred to as NMR (Nuclear Magnetic Resonance) has been known for a long time. It has aroused a very strong interest in the petroleum industry twenty years ago thanks to the advances made in data acquisition and processing. The principle of this technique is described in many references, notably by Seevers 1966, Timur 1968, Kenyon 1989 or Godefroy 2001, already mentioned above. To present things in a very simplified way, measurement consists in first exciting the protons along a magnetic field imposed by the device, then in letting the protons come back to their initial state (relaxation). In porous media, the magnetic relaxation signal obtained depends on the nature of the fluids contained in the rock, and on the pore geometry. For a proton, relaxation (T2) is all the faster as it is located in a low-extension pore. T2 is related to surface relaxivity P2, surface area S and volume V by the relation:

$$\frac{1}{T_2} = P_2 \frac{S}{V}$$

I-2.1 Porosity Evaluation

When the nature of the fluid contained in the pores is known, the amplitude of the NMR signal can be converted into volume. This allows to directly evaluate the amount of fluid contained in the rock, i.e. directly the difference between the total volume of rock and the solid volume ($V_t - V_s$). If the total volume is known, the value of the porosity can be deduced. In a more laboratory-oriented context, the total volume has to be measured separately by means of a powder pycnometer for example, or from the dimensions of the sample (core).

$$\phi = \frac{V_t - V_s}{V_t}$$

NMR measuring devices are widely used for logging. In this context, the total volume corresponds to the measurement volume of these devices (corrected for edge effects).

I-2.2 Permeability Evaluation

Various empirical correlations have been proposed for evaluating the value of the permeability from the distribution characteristics of T2. NMR logging has been presented as a predictive tool for measuring the permeability in a well. This technique has also been considered for measurements on cuttings since it is fast and flexible, in the field as well as in the laboratory. The models are based on the use of measuring times T1 and T2 which represent the respectively longitudinal and transverse relaxation times from the NMR signal. A synthesis of the existing models is given in the aforementioned reference Fleury et al. (2001). In the following publications, also mentioned above, permeability k is modelled by the empirical relations:

Seevers (1966) $k = C(1 - S_{wi})T_1^2\phi$

Timur (1968) $k = C\frac{1}{S_{wi}^2}\phi^{4.4}$

Kenyon (1988) $k = CT_{2ML}^2\phi^4$

In the previous models, the value of $S_{wi}$ is obtained from the signal of T2 by considering the volume which corresponds to short relaxation times (small pores) under a certain cutoff threshold. In the literature, the default values of this cutoff threshold are 33 ms for sandstones in contrast to 100 ms for carbonates (purely empirical values). FIG. 1 illustrates the use of the cutoff threshold. All these expressions were successfully validated on a large number of samples belonging to the same petrophysical group.

When changing petrophysical groups, the prediction quality can decrease significantly. This results from the NMR measurement, which is not a direct permeability measurement. Thus, more general relations relating the permeability to the NMR signal are preferably used:

$$k = CT_2^a\phi^b, \quad k = C\frac{1}{S_{wi}^a}\phi^b$$

where C, a and b Depend on the Porous Structure.

Parameters C, a and b thus have to be adjusted to obtain satisfactory predictions for each rock.

I-3 NMR Measurements on Cuttings

In the laboratory

A NMR measurement technique allowing to obtain an evaluation of the porosity of cuttings obtained by crushing core samples of known properties is outlined very roughly by Santarelli et al. (1998) mentioned above. Only the comparison with the reference measurements is given. A good agreement is obtained with the reference measurements, but a certain degradation is observed in relation to the gas (helium) expansion technique which is translated into a lower correlation coefficient ($R^2$=0.87) and a greater mean deviation in relation to the first bisectrix (of the order of 3-4 porosity units).

In the Field

The use of a field NMR device allowing to determine the porosity and the permeability from cuttings short after they have reached the surface is described by Nigh et al. (1985). The first measuring stage consists in properly identifying the cuttings recovered in terms of depth (lag time calculation). It is recommended to frequently inject tracers into the mud in order to contribute towards readjustment. For a drilling operation carried out with water-base mud, the cuttings are first cleaned in a washing cell filled with 3% NaCl brine. The operation is repeated until the cuttings are clean. If an oil-base mud is used, the cuttings are cleaned with solvents. The equivalent of two teaspoonfuls is necessary for one measurement. Once the cleaning operation complete, the cuttings are examined to check that they really come from the reservoir levels corresponding to the lag time. The cuttings selected are then fed into a cell filled with water and placed under vacuum so as to completely saturate them with liquid. The cuttings are thereafter removed from the cell and contacted with a ceramic to remove the water from the surface, and the total volume of rock is calculated. The NMR measurement allows to directly determine the value of the porosity and of the irreducible water saturation $S_{wi}$. The results obtained show that the porosity measurement systematically underestimates the results of the measurements on core samples and the logs. The authors attribute these differences to depth readjustment problems and to the fact that the cuttings give a value corresponding to a precise depth whereas there is an averaging effect with the logging tools (30 cm on average). According to the saturation procedure described in the publication (which is not the one recommended in the laboratory: API standards), it is also possible that part of the pore network has remained gas-saturated, which could explain the underestimation observed.

SUMMARY OF THE INVENTION

The method according to the invention allows to determine the permeability of an underground medium from NMR measurements of the permeability of rock fragments from the medium.

It comprises:

A) a calibration stage including:
a) direct permeability measurement in the laboratory from the rock fragments,
b) measurement of parameters of signals obtained by NMR of the rock fragments, and
c) adjustment of the parameters of a selected empirical relation that relates the value of the permeability to parameters deduced from the signals obtained by NMR, using the direct measurements performed on the rock fragments, and B) using this optimum relation to determine the permeability of the medium only from NMR logs for which no direct permeability measurements are available.

Direct permeability measurement in the laboratory from the rock fragments comprises for example measuring the pressure variations within a vessel filled with a fluid containing the rock fragments after it has been communicated for a predetermined time with a tank containing the same fluid under pressure, measuring the volume effectively absorbed by the rock fragments and modelling the evolution of the pressure or of the volume in the vessel, from initial values selected for the permeability of the rock fragments, that are iteratively adjusted so that the modelled pressure evolution best adjusts with the measured cuttings permeability evolution.

The method comprises for example measuring at least one of the respectively longitudinal and/or transverse relaxation times of the NMR signals.

The method is notably advantageous in that it provides calibration of the NMR permeability logs on the basis of measurements from simple cuttings which are easier and less expensive to obtain than core samples. The calibration carried out between the measurements on the NMR signals and those obtained by direct measurements allows to improve the degree of prediction of the empirical permeability evaluation formulas. The results are also obtained much more rapidly than with core samples.

II BRIEF DESCRIPTION OF THE FIGURES

Figure 4:
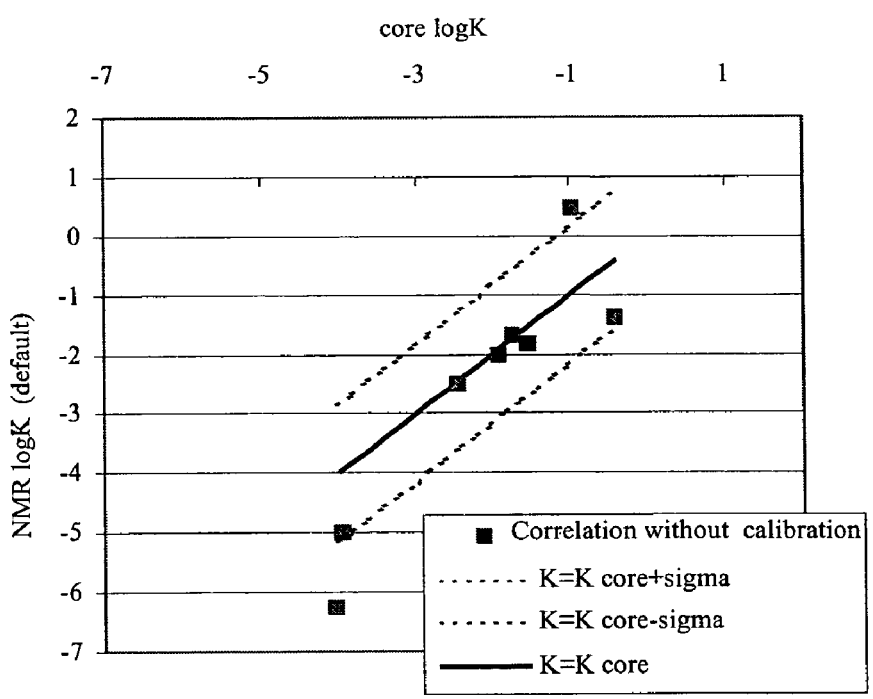
Figure 5:
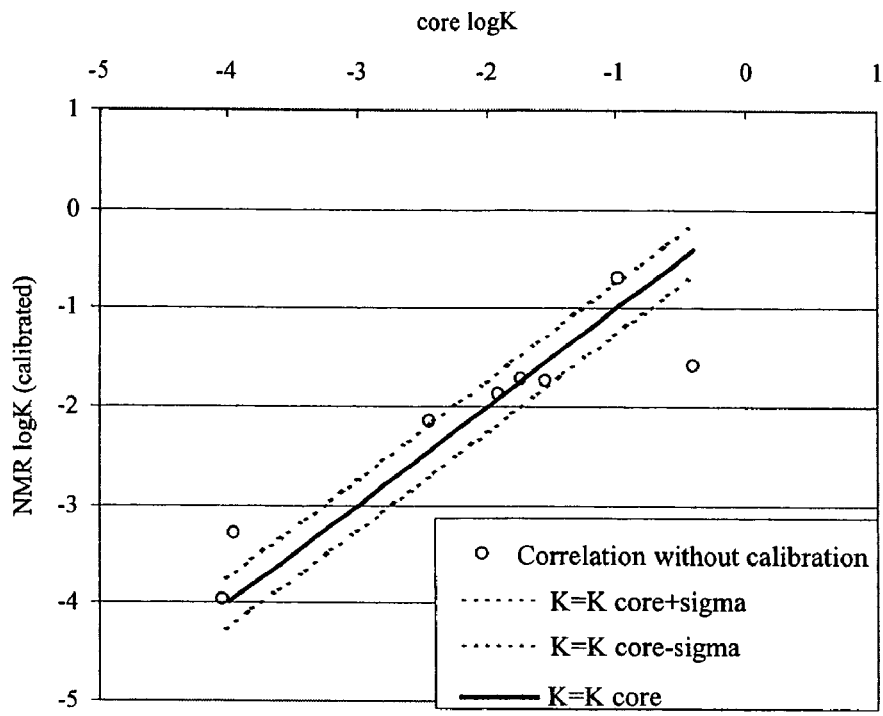

FIGS. 1a, 1b show a distribution of relaxation time T2 obtained from a sandstone core and the value of Swi obtained from this distribution by applying the default cutoff value of 33 ms and a curve connecting the cumulative saturation to this time T2, FIG. 2 shows a comparison between a distribution of T2 obtained on a permeable core and a distribution of T2 obtained from the rock fragments of the same core, crushed and drained, FIG. 3 shows the various distributions of T2 obtained from the 8 cuttings samples tested, all belonging to the same rock class, where the peaks of T2 have very different values depending on the samples (between 3 ms and 140 ms), FIG. 4 shows the comparison between the permeability value obtained from the NMR signal (Kenyon formula) using the default parameters and the reference permeability value obtained by direct measurement on a core before crushing. In this case, the standard deviation between the estimated value and the reference value is of the order of a factor 10 (11.5), FIG. 5 shows the comparison between the permeability value obtained from the NMR signal (Kenyon formula) after the calibration stage and the reference permeability value obtained by direct measurement on a core before crushing, and FIG. 6 shows the principle of the NMR type log calibration method and its use within the context of underground formation characterization.

III DETAILED DESCRIPTION

Figure 6:
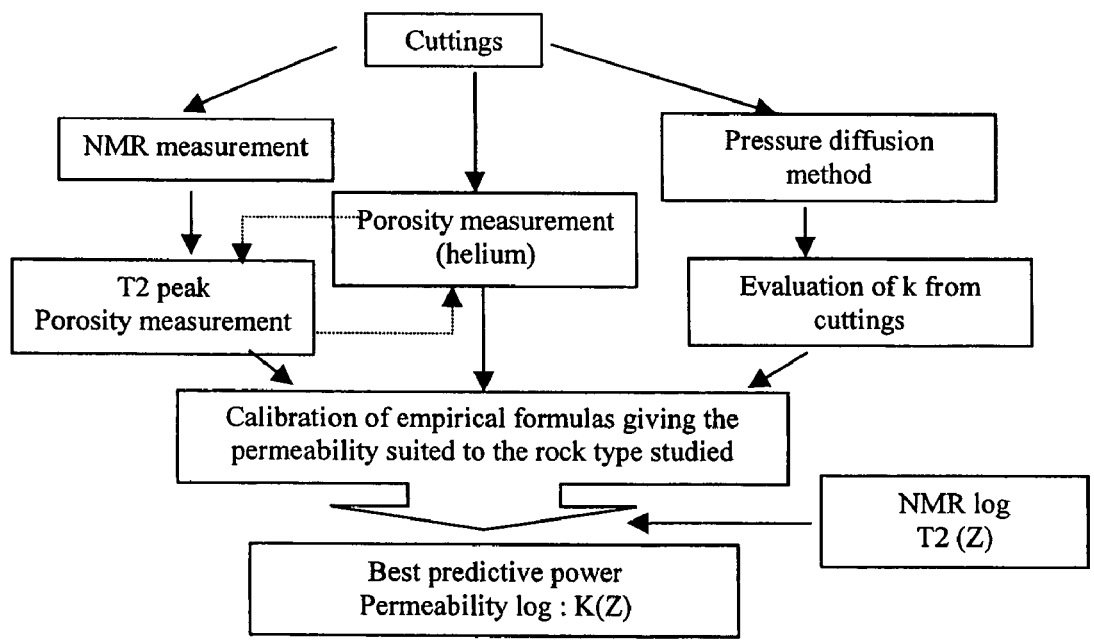

The general principle of the method of calibrating NMR logs from direct measurements on rock fragments is illustrated in FIG. 6. The method is based on three distinct stages: permeability and porosity measurement from previously dried rock fragments, NMR measurement from liquid-saturated fragments and calibration of an empirical permeability formula of Kenyon type. These three stages are reminded hereafter with a practical illustration from a series of 8 measurements on rock fragments of same nature but having different properties.

III-1 Preparation

The cuttings are recovered at the surface. Calculation of the lag time allows, as it is well-known, to readjust the cuttings collected in relation to a depth in the well. The first stage consists in cleaning the cuttings with suitable procedures according to the nature of the drilling fluid (water-base or oil-base mud) and of the fluids in place in the reservoir (oil or gas). A standard procedure consists in cleaning the cuttings with solvents in a Soxhlet type device, then in drying them in a drying oven at 60° C.

III-2 Permeability and Porosity Measurement

The method described in the aforementioned French patent applications EN-02/02,242 or EN-03/03,742 is applied to measure the permeability of rock fragments. The rock fragments are therefore dipped into a containment vessel containing a viscous fluid. The vessel is then communicated with a tank containing the same fluid under pressure, so as to compress the gas trapped in the pores of the rock. According to a first implementation mode, this communication can be very short and followed, after a latency time, by measurement of the evolution of the pressure in the vessel. According to another implementation mode, this communication can be long enough to allow to observe and to measure the variation of the volume effectively absorbed by the rock fragments.

The evolution of the pressure or of the volume in the vessel is then modelled from initial values selected for the permeability and the value thereof is iteratively adjusted so that the modelled evolution best adjusts with the measured evolution of the parameters measured in the vessel.

This procedure gives excellent results. The permeability values k of the rock fragments are totally in accordance with the reference measurements obtained from core samples.

The method described in the aforementioned French patent application EN-03/03,742 is applied to measure the porosity of the rock fragments. The conventional gas expansion (helium expansion) method is then used to obtain the value of the solid volume of the rock and a powder pycnometer is used to obtain the value of the total volume (envelope volume) of the cuttings. A measurement of the porosity of the dry cuttings is thus obtained.

III-3 NMR Measurement on the Cuttings

Another part of the previously cleaned cuttings is used to carry out the NMR measurements. The total volumes of the cuttings used are first measured by means of a powder pycnometer. The cuttings are then saturated with 20 g/l brine. The rock fragments are thereafter drained in a damp cloth so as to remove the water trapped between the various rock fragments. It is also possible to use a porous ceramic to drain the water trapped between the fragments.

The drained cuttings are then fed into the NMR measuring device, which allows to obtain a distribution of T2. Prior tests have shown that the distribution obtained for T2 from rock fragments is similar to the distribution obtained from a core of the same rock as regards both the shape and the location of the peak of T2, as shown in FIG. 2, which is particularly important within the context of calibration of the permeability formulas.

Since the nature of the fluid saturating the rock fragments is known, the volume of fluid saturating the rock, i.e. $V_t-V_S$, can be directly calculated. Since $V_t$ has been measured otherwise, a measurement of the porosity can be deduced. This porosity value is then compared with the porosity value obtained on the dry cuttings by helium expansion, which allows to detect a possible draining problem before passage into the NMR device.

III-4 The Results Obtained

The previous measuring techniques were applied for a series of 8 rock fragment samples, of same nature but with different properties, obtained by crushing cores on which the permeability had been previously measured. All of the samples belong to the same carbonate type rock family.

The results are given in the table hereunder.

| Name | Phi % | T2 (peak) ms | K reference core md | K fragments md | K NMR default md | K NMR optimized md |
|------|-------|--------------|---------------------|----------------|------------------|--------------------|
| E1 | 2.75 | 3.07 | 9.0E−05 | 1.1E−04 | 5.4E−07 | 1.1E−04 |
| E2 | 8.00 | 27.46 | 3.5E−03 | 1.3E−02 | 3.1E−03 | 7.4E−03 |
| E3 | 9.77 | 47.5 | 1.8E−02 | 2.4E−02 | 2.1E−02 | 1.9E−02 |
| E4 | 7.89 | 62.45 | 2.8E−02 | 4.2E−02 | 1.5E−02 | 1.9E−02 |
| E5 | 19.79 | 142 | 1.0E−01 | 1.5E−01 | 3.1E+00 | 2.0E−01 |
| E6 | 8.75 | 41.4 | 1.2E−02 | 3.7E−02 | 1.0E−02 | 1.4E−02 |
| E7 | 10.90 | 54.5 | 3.9E−01 | 2.4E−01 | 4.2E−02 | 2.7E−02 |
| E8 | 3.29 | 9.18 | 1.1E−04 | 4.0E−04 | 9.9E−06 | 5.2E−04 |

On the basis of the Kenyon law, a general relation was used to evaluate the permeability value from the NMR signal:

$$k = C T_{2peak}^a \phi^b$$

The parameters recommended by Kenyon for carbonate rocks are C=0.1, a=2 and b=4.

The results obtained with this law are reminded in FIG. 4. They show that the standard deviation in relation to the reference measurements on cores is of the order of ten approximately, which is not satisfactory within the context of the evaluation of the properties of an underground reservoir.

The parameters of the Kenyon law were then optimized from direct permeability measurements obtained on the rock fragments. The following set of parameters is then obtained: C=0.0086, a=1.15 and b=1.57.

The results obtained with this law are reminded in FIG. 5. They show that the standard deviation in relation to the reference measurements on cores is significantly reduced in relation to the previous case where default parameters were used. In this case, the standard deviation between the calculated value and the reference value is much better than in the case where default parameters are used (a factor 2 in contrast to a factor 10 before). The standard deviation is here brought back to 2.5, which is quite satisfactory.

The formula thus optimized can be applied to all the NMR logs available in the zones corresponding to this type of rock and for which no direct permeability measurements are available.

If the reservoir comprises several rock types, the previous operation can be repeated for each rock family identified. This thus allows to apply the most suitable and the most predictive permeability calculation formula according to the nature of the rock along the well.

The invention claimed is:

1. A method of determining the permeability of an underground medium from NMR logs, comprising calibrating NMR logs from NMR and permeability measurements of rock fragments from said medium, comprising:

A) a calibration stage including:
   a) direct permeability measurement in the laboratory from the rock fragments comprising measuring the pressure variations within a vessel filled with a fluid containing the rock fragments after it has been communicated for a predetermined time with a tank containing the same fluid under pressure, measuring the volume effectively absorbed by the rock fragments and modelling the evolution of the pressure or of the volume in the vessel, from initial values selected for the permeability of the rock fragments, that are iteratively adjusted so that the modelled pressure evolution best adjusts with the measured cuttings permeability evolution
   b) measurement of parameters of signals obtained by NMR of the rock fragments, and
   c) calculation of the parameters of a selected empirical relation that relates the value of the permeability to parameters deduced from the signals obtained by NMR, using the direct measurements performed on the rock fragments, and B) obtaining permeability logs by using parameterization to determine the permeability of the medium only from NMR logs for which no direct permeability measurements are available.

2. A method as claimed in claim 1, wherein at least one of the respectively longitudinal and/or transverse relaxation times (T1, T2) of the NMR signals is measured.

3. a method as claimed in claim 1, wherein the rock fragments are cuttings from a hydrocarbon reservoir.

\* \* \* \* \*